United States Patent [19]

Lonberger

[11] 4,176,401
[45] Nov. 27, 1979

[54] DIGITAL COMMUNICATIONS SYSTEM
[75] Inventor: John W. Lonberger, Newark, Ohio
[73] Assignee: Owens-Corning Fiberglas Corporation, Toledo, Ohio
[21] Appl. No.: 882,499
[22] Filed: Mar. 1, 1978
[51] Int. Cl.² .............................................. H03K 3/42
[52] U.S. Cl. .................................. 364/900; 307/311; 250/199; 250/551
[58] Field of Search ... 364/200 MS File, 900 MS File; 307/311; 250/199, 551; 179/2 DP, 1 SW

[56] References Cited
U.S. PATENT DOCUMENTS

| | | | |
|---|---|---|---|
| 3,460,098 | 8/1969 | De Blauw | 364/900 |
| 3,970,784 | 7/1976 | Meijerink | 250/551 |
| 4,016,369 | 4/1977 | Pedersen | 364/900 |
| 4,058,735 | 11/1977 | Tippner | 250/551 |

*Primary Examiner*—Gareth D. Shaw
*Assistant Examiner*—C. T. Bartz

*Attorney, Agent, or Firm*—Ronald C. Hudgens; Patrick P. Pacella; Oliver E. Todd, Jr.

[57] ABSTRACT

An interface for use in serial digital data systems incorporates photo-coupling devices. The interface comprises three photo-couplers in the input and output circuits of a data station. Light emitting elements of two photo-couplers are connected in series with the driven element of a third coupler across a reference power supply. The driven element of the third coupler is connected to the output of one data station and also is shunted by the output from a preceding station. Either output causes a current flow to produce light outputs from the two light emitting elements. The light, in turn, operates the driven elements of the other two couplers. The driven element of one of the two couplers supplies data to the one data station, the driven element of the other coupler retransmits data to the next station. The interface is adaptable for use in a closed loop data system by adding a fourth photo-coupler.

8 Claims, 3 Drawing Figures

DIGITAL COMMUNICATIONS SYSTEM

BACKGROUND OF THE INVENTION

The invention relates to a data transfer interface and more particularly to a serial digital data interface system useful to disseminate digital data from a microprocessor or central station to any number of remote or slave stations as well as from any remote station to any other remote station or the microprocessor.

Digital computer technology, numerical machine and process control, large scale integrated circuits and microcircuit sophistication are combining to produce a revolution in the field of manufacturing and production information gathering and dissemination. The operations performed in a subsequent operation may be dependent upon the precise conditions under which the previous operation was performed. Production data required by a machine performing one phase of a manufacturing process may be stored in a central memory unit. Thus there is a necessity for a constant flow of data along a production line—data that must be produced, routed, verified and received throughout a complex system.

The requirement that any station be capable of receiving data from or transferring data to any or all other stations in the system is of some moment. One approach which requires a direct two-way interconnection between each station becomes intractable when the number of stations is great. Such an approach has often been abandoned in favor of a single data line along which the various stations are serially connected. A message is then preceded by an address code which identifies the station or stations to which it is addressed. The data is received and stored by every station in sequence. If the station is one to which the data were not addressed, the data would be retransmitted to the next, downstream station. Alternately, if the data were received by an addressed station, the data would be retained as well as retransmitted. Such a system has two shortcomings. First, since the data is transmitted ad seriatim through the stations, every station must be functioning in order for the data to be received by any downstream station. Secondly, a station cannot, without additional circuitry, transmit upstream, that is, it cannot transmit data to a station from which it receives data.

Optical couplers including light emitting diodes have proven to be a highly practical method of digital data transmission and an exemplary transmission system employing them is disclosed in U.S. Pat. No. 3,970,784. This patent discloses digital data stations both having receive and transmit capability linked by a single bi-directional data line. It is clear, however, that if this system were to be used with multiple stations, it would be necessary to utilize a separate pair of data lines to interconnect each station with every other station.

SUMMARY OF THE INVENTION

The instant invention relates to a serial digital data information interface which overcomes the difficulties of prior art data interface systems. The interface includes a series string of photo-couplers or optical-isolation devices operating at the input and output of each data station. Each photo-coupler consists of a light source such as a light emitting diode (LED) optically coupled to a light responsive driven element such as a photo transistor or light dependent resistor (LDR). The light emitting diodes of two optical couplers are connected in series with the driven element (i.e., photo transistor) of the third coupler across the output of a direct current power supply.

When a station is receiving data, the series driven element of the interface is intermittently shunted by the serial data pulses from an upstream transmitting station. Current is then allowed to flow through the two LEDs of the interface thereby generating light. The first LED drives an optically coupled driven element which re-transmits the data to a subsequent or downstream station. The second LED activates an optically coupled driven element which supplies the data to the adjacent station. The system may be extended almost without limit and may further include a closed loop feature wherein the last station in the line retransmits the data to the initiating station.

To transmit, the light emitting diode of the optical-coupler which is shunted by the upstream station when it is transmitting data is activated by the serial digital data pulses from the output of the adjacent station. Current then flows through the driven element, such as a photo transistor, and through the light emitting diodes of the other two photo-couplers in the interface. Not only are serial data pulses transmitted to the next station, but also the transmitting station is capable of verifying the transmission by the utilization of the photo-coupler output used to receive the data pulses. In a closed loop system any data station may thus transmit to any other data station. The interface is modified to prevent transmission through an interface while the associated station is transmitting.

It is therefore an object of the instant invention to provide a data interface for use with serial digital data receiving and transmitting stations.

It is a further object of the instant invention to provide a digital data interface which eliminates the storage and retransmittal of data within a station to which the data was not addressed.

It is still a further object of the instant invention to provide a data interface system which is capable of closed loop operation.

It is also an object of the instant invention to provide a serial digital data interface wherein each data station is capable of receiving and transmitting data from every other data station on a single pair of data lines.

It is also an object of the instant invention to provide a digital data interface wherein each transmitting station is immediately capable of reading and verifying the data from the data lines on which it is currently transmitting.

DESCRIPTION OF THE PREFERRED EMBODIMENT

Figure 1:
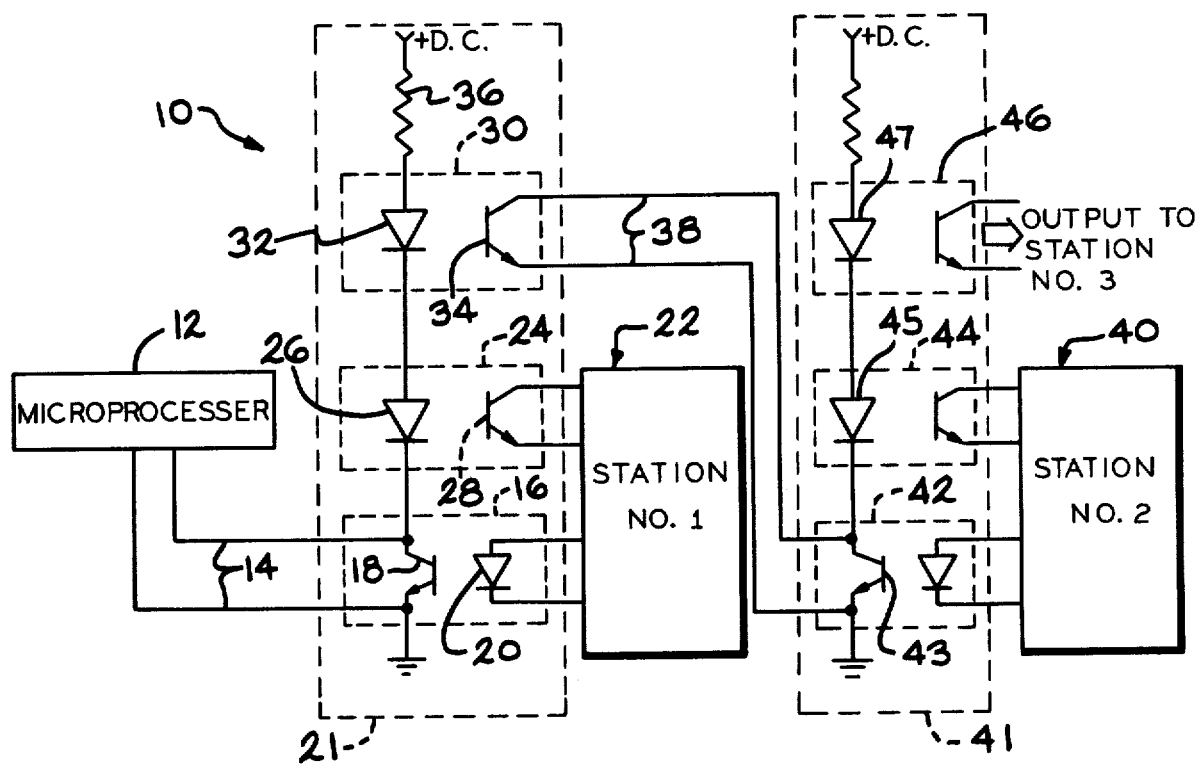
FIG. 1 is a schematic circuit diagram of a digital information system employing the instant invention.

Referring now to FIG. 1, a digital information system employing the instant invention is generally designated by the numeral 10. A microprocessor 12 provides serial digital data pulses on a pair of data lines 14. The microprocessor 12 may be of virtually any size and include any quantity of memory, computational and software devices. The microprocessor 12 is shown here solely as a representative source of digital information and should be construed neither as any part of the invention herein nor viewed as a limitation thereof. The digital information pulses from the microprocessor 12 are passive, that is to say, no voltage is produced in the line 14 by the microprocessor 12. Rather, in the zero signal or null state the data line 14 is open circuited by the microprocessor 12 and in the high or positive signal state the data lines 14 are shorted together in the microprocessor 12.

The output of the microprocessor 12 on the data lines 14 is connected to an interface 21 at a first data station 22. The lines 14 are connected in the interface 21 to shunt a driven element, namely, a light dependent resistor (LDR) or photo transistor 18 which is part of a first photo-coupler 16. The first photo-coupler 16 also includes a light source, generally, a light emitting diode (LED) 20 in optical communication with the photo transistor 18. The light emitting diode 20 is connected to the data output of the first data station 22, the operation of which will be described subsequently. The photo transistor 18 of the photo-coupler 16 is connected in series with a light emitting diode 26 of a second photo-coupler 24 and another light emitting diode 32 of a third photo-coupler 30. The light emitting diodes 26 and 32 and the photo transistor 18 are connected in series with a current limiting resistor 36 across the output of a low voltage direct current power supply (not shown) which typically delivers a nominal five volts.

The photo-coupler 24 includes a light dependent resistor or photo transistor 28 which is optically coupled to the light emitting diode 26. Finally, the photo-coupler 30 includes a light dependent resistor or photo transistor 34 which is optically coupled to the light emitting diode 32. The output of the photo transistor 34 is applied on a pair of data lines 38 to an interface 41 at a second data station 40 which is remote from the first data station 22.

The interface 41 at the data station 40 is identical to data interface 21 and includes three photo-couplers 42, 44 and 46 which are operably connected as has been previously described in connection with the interface 21.

The operation of the data interface is straightforward. The microprocessor 12 provides data pulses on the data lines 14 by alternately opening and short-circuiting the data lines 14 as has been previously described. The intermittent shunting of the photo transistor 18 which normally has a high impedance, lowers the resistance of the series circuit formed by the resistor 36, the light emitting diodes 26 and 32 and the photo transistor 18 to produce a current flow through the light emitting diodes 26 and 32 and resistor 36 from the DC power source. Light from the energized light emitting diodes 26 and 32 produces a resistance decrease or signal output from the associated light dependent resistors or photo transistors 28 and 34, respectively. The photo transistor 28 thus supplies the data pulses transmitted by the microprocessor 12 to the first data station 22. Likewise, the photo transistor 34 transmits the data pulses from the microprocessor 12 on the data lines 38 to the next data station 40. The data pulses in the data lines 38 are functionally identical to the data pulses on the data lines 14 from the microprocessor 12 and shunt the passive element, namely a light dependent resistor or photo transistor 43 in the photo-coupler 42, causing a current flow from a DC power source through the active elements, namely light emitting diodes 45 and 47 in the photo couplers 44 and 46, respectively. The output of the photo-coupler 44 supplies the pulsed data from the interface 21 to the data station 40 and the output of the photo-coupler 46 supplies the pulsed data information to the next data station (data station number 3) as is indicated in FIG. 1. Thus, it can be appreciated that the data interface system of the instant invention can be utilized in cascade to transmit and retransmit data pulses to any number of data stations within practical limits. It should be noted that data pulses from the microprocessor 12 will appear on the data lines 38 even when the data station 22 is not functioning, as when the station 22 is down for servicing.

In order to transmit data, a data station, such as the first data station 22, pulses the light emitting diode 20 of the photo-coupler 16. This decreases the impedance of the drum element 18 which affects the series connected photo-couplers 24 and 30 in a fashion similar to the data pulses received on the data lines 14 from the microprocessor 12. Light generated by the light emitting diode 20 lowers the resistance of the photo transistor 18 which causes current to flow through it to illuminate the light emitting diodes 26 and 32. Light pulses from the diode 32 fall on the photo transistor 34 which reproduce the data pulses at its output connected to the data lines 38. Thus, the pulsed data is transmitted on the data lines 38 to the interface 41 at the second data station 40. Furthermore, the data pulses are available at the output of the photo transistor 28 of the photo-coupler 24 and readable by the data station 22 as an immediate check on the data transmitted by it. It can thus be appreciated that, as illustrated in FIG. 1, any data station may transmit data to any other station downstream of it and that any station may receive data from any other data station upstream of it.

Digital data may be addressed to any one of a specific group of data stations by the use of address prefixes appended to the data. Each station is then programmed or connected to be responsive to a specific digital address. Furthermore, since data is transmitted around an unaddressed station in a system utilizing the instant invention, rather than through it, by incorporating dead band timing into the data stations, an unaddressed station may be designed to disregard a transmission not addressed to it. Basically, this feature requires circuitry or programming which deactivates the data input section of a data station once an address prefix for a different station has been detected on the data lines. The station continues to monitor the data lines for dead time. After an interval of dead time (e.g., seven milliseconds), the unaddressed data station will reactivate its data input section and monitor the data lines for a transmission addressed to it.

Figure 2:
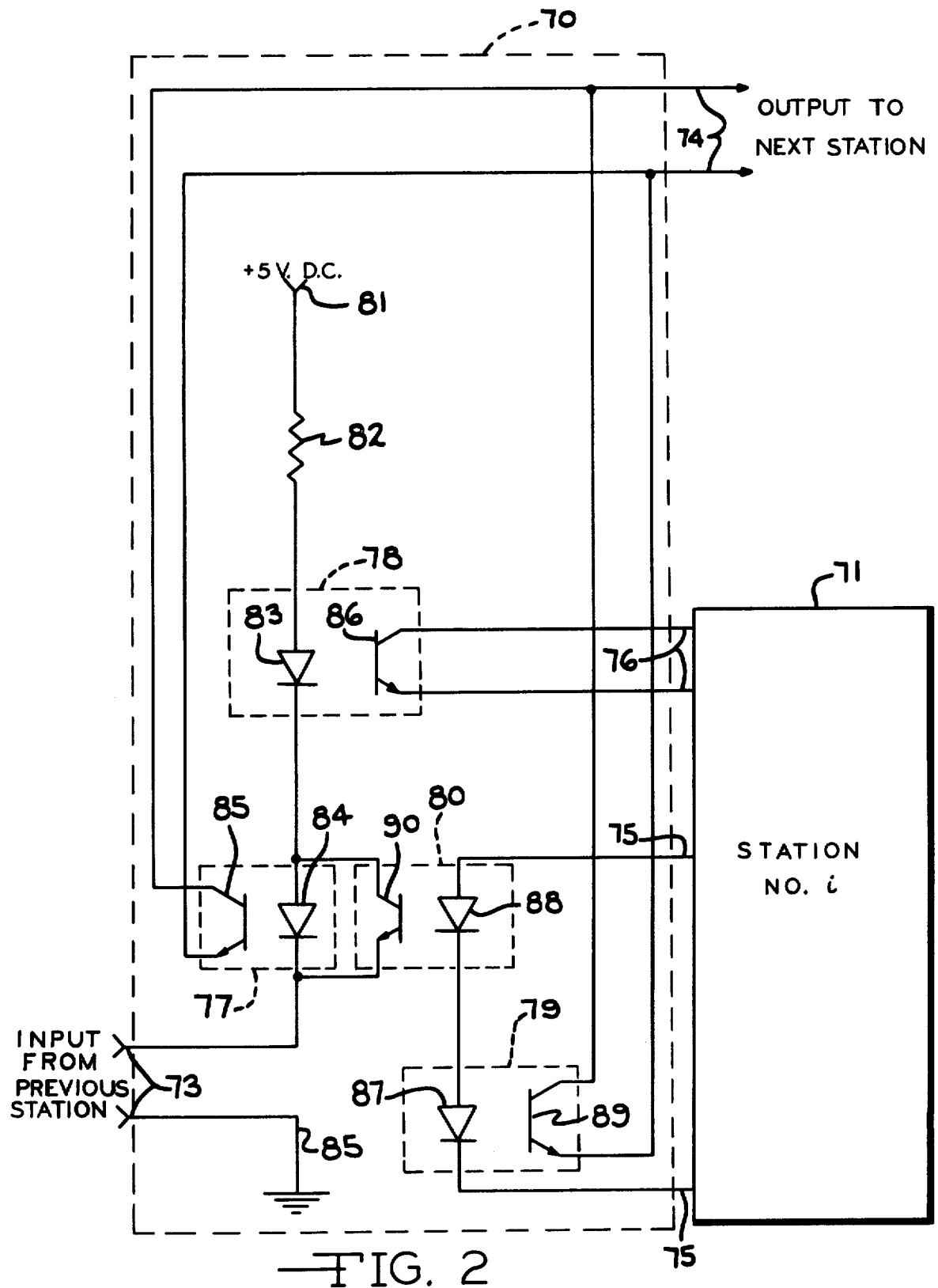
FIG. 2 is a block diagram showing a closed loop digital information system having interfaces in accordance with a modified embodiment of the instant invention.

Referring now to FIG. 2, a data interface system 49 of the instant invention is illustrated in a closed loop configuration. The system includes a central station 50 having an interface 51 connected to a microprocessor or other data gathering and distribution system 52 in a manner which has been previously described. A pair of data lines 53 transfers serially pulsed digital data to a first data terminal 54. The first data terminal 54 likewise includes the interface 55 connected to a data station 56. The output of the first data terminal 54 is carried in a pair of lines 57 to a second data terminal (not shown) and so on to an nth data terminal 58. The nth data terminal 58 likewise includes an interface 59 and a data station 60. The output of the nth data terminal 58 is returned over a pair of data lines 61 to the central station 50 and is connected through the interface 51 as an input signal to the processor 52 through the interface 51. The serial digital data system illustrated in FIG. 2 is a closed loop system and not only permits an immediate check by the processor 52 of data transmitted by it but also permits any data station in the data transmission system to transmit data to any other station either upstream or downstream from it since the data signal will be circulated about the entire closed loop system and return to the data generating station. By using an addressing system and dead band monitoring, any station can address any other station connected in the closed loop. The two stations then can communicate back and forth so long as the circuit is not allowed to be inactive for the predetermined dead band time. When the communication is completed and the circuit is dead for the predetermined time, all stations will become reactivated and any of the stations in the circuit can address and communicate with any other station.

The interface shown in FIG. 1 does not work satisfactorily in a closed loop system such as that shown in FIG. 2. This is due to the fact that once one of the stations applies a data pulse to the loop, the entire loop goes to a high logic level. The high logic level will then continue indefinitely even after the data pulse is terminated by the transmitting station.

Figure 3:
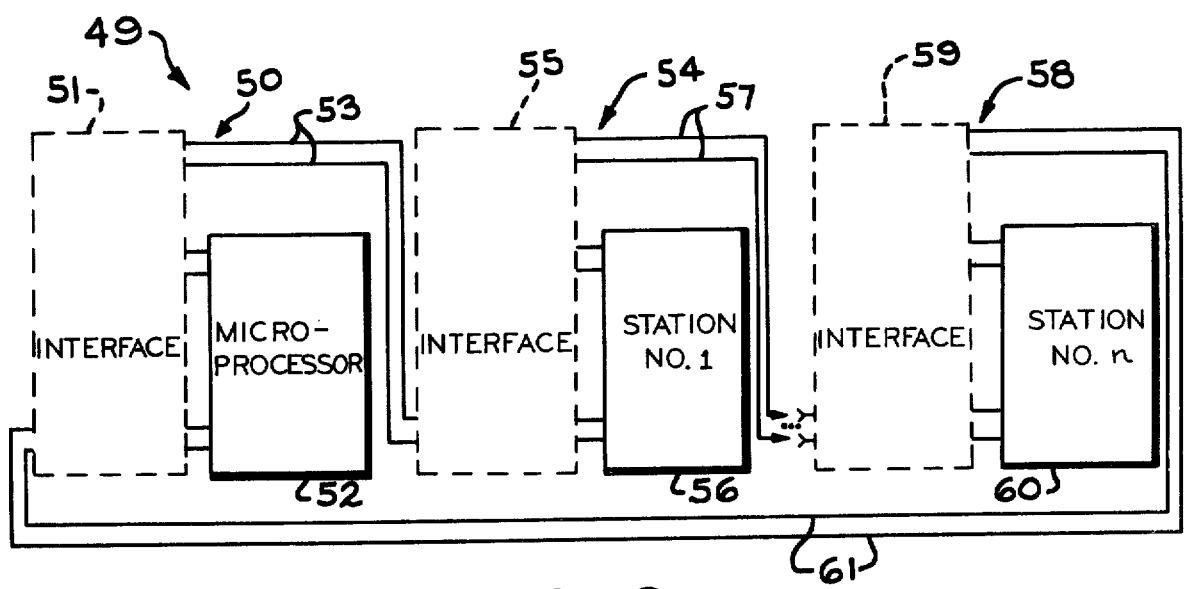
FIG. 3 is a schematic circuit diagram of the modified interfaces in the closed loop system of FIG. 2.

Turning now to FIG. 3, a modified interface 70 is shown connected to a data station 71 which is arbitrarily designated station No. i. The station 71 may be any one of the stations including the microprocessor 52, the station 56 or the other stations in the closed loop of FIG. 2. The interface 70 has a pair of data input lines 73 which are connected to the output from the interface of the previous station in the closed loop and a pair of output data lines 74 which are connected to the input to the interface at the next data station in the closed loop. The interface 70 also has a pair of input data lines 75 from the station 71 and a pair of output data lines 76 connected to the station 71. The interface 70 generally comprises four optical couplers 77–80. A low voltage power supply, such as a conventional five volt DC power supply, is connected from a terminal 81 through a current limiting resistor 82, an LED 83 in the coupler 78, an LED 84 in the coupler 77, and the input data lines 73 to ground 85. When a data pulse is received on the lines 73 from the previous station, the circuit is completed to energize the LEDs 83 and 84. The LED 84 is optically coupled to a phototransistor 85 which is connected to the output lines 74 for applying the pulse to the next station in the closed loop. Similarly, the LED 83 in the photocoupler 78 is optically coupled to a phototransistor 86 which applies the received data pulse to the input lines 76 to the station 71. The photocouplers 79 and 80 operate when data is outputed from the station 71. Generally, the photocoupler 79 applies the output data from the station 71 to the output lines 74 and the photocoupler 80 inhibits a through transmission from the input lines 73 to the output lines 74. The photocoupler 79 includes an LED 87 and the photocoupler 80 includes an LED 88 which are connected in series across the output lines 75 from the station 71. When the station 71 applies an output pulse on the line 75, both LEDs 87 and 88 are energized. The energized LED 87 in the photocoupler 79 excites a phototransistor 89 which is connected across the output lines 74 in parallel with the phototransistor 85. Thus, the output data from the station 71 is applied over the line 74 to the next data station in the closed loop. The illuminated LED 88 excites a phototransistor 90 in the optical coupler 80. The phototransistor 90 is connected to shunt the diode 84 in the photocoupler 77. As a consequence, a data pulse received on the input lines 73 from the previous station in the closed loop is shunted around the photocoupler 77 while the station 71 is transmitting data. However, the input pulse received on the lines 73 will still illuminate the LED 83 in the photocoupler 78. This permits the data transmitted from the station 71 to pass around the entire loop to the photocoupler 78 and thence to the input lines 76 for the station 71 for verification. Since the data passing around the entire closed loop does not pass through the photocoupler 77, the closed loop will go to its normally low logic level when an output pulse from the station 71 is removed from the line 75.

If desired, a relay may be connected between the input and output lines for each of the interfaces shown in either FIG. 1 of FIG. 3. The relay at each interface is normally maintained open by the low voltage power supply which drives the interface. In the event that the low voltage power supply fails or a station is shut down, the relay closes to connect the input lines for that station to the output lines for that station to maintain continuity in the system.

It will be apparent to those skilled in the art that various modifications may be made to the preferred embodiment described above wthout departing from the spirit and scope of the following claims. As used herein, the term photo-coupler means any type of radiant energy coupling means having a sufficiently fast response time to handle the data transmitted in the system incorporating the interface.

What I claim is:

1. A digital serial data interface for connecting a data transmitting and receiving station having an input and an output to the output of a preceding station and to the input of a succeeding station, said interface comprising first, second and third photocouplers each having a drive element optically coupled to a driven element, a voltage source, means connecting the drive elements of said first and second photocouplers and the driven element of said third photocoupler in series with said voltage source, means connecting the output of said preceding station in parallel with said driven element of said third photocoupler, means connecting said drive element of said third photocoupler to the output of said data transmitting and receiving station, means connecting said driven element of said second photocoupler to the input of said data transmitting and receiving station, and means connecting said driven element of said first photocoupler to the input of said succeeding station.

2. The data interface of claim 1, wherein said drive elements comprise light emitting diodes.

3. The data interface of claim 1, wherein said driven elements comprise phototransistors.

4. The data interface of claim 1, wherein said driven elements comprise light dependent resistors.

5. A system for transferring serial data pulses between a plurality of data stations arranged in a sequence, each data station having an input and an output, said system comprising a separate pair of conductors extending between each two adjacent stations in the sequence, a separate interface associated with each station, each interface including a first photocoupler having a drive element connected to a first input and optically coupled to a driven element connected to a first output, a second photocoupler having a drive element connected to a second input and optically coupled to a driven element connected to a second output, a third photocoupler having a drive element connected to a third input and optically coupled to a driven element connected to a third output, a voltage source, means connecting said voltage source, said first input, said second input and said third output in series, means connecting said first output to the conductors extending to the succeeding station in the sequence, means connecting said second output to the input of the station associated with such interface, means connecting said third input to the output from such associated station, and means connecting said third output to the conductors extending from the preceding station in the sequence.

6. A serial digital data interface for connecting a data transmitting and receiving station having an input and an output to an input data line from a preceding data station and to an output data line to a succeeding data station, said interface comprising first photocoupler means connecting said input data line to said output data line, second photocoupler means connecting said input data line to said input of said data receiving and transmitting station, and third photocoupler means connecting said output of said data receiving and transmitting station to said output data line.

7. A digital data interface, as set forth in claim 6, and further including fourth photocoupler means responsive to said output of said data receiving and transmitting station for blocking data passage from said input data line to said output data line.

8. A digital data interface, as set forth in claim 7, wherein each of said photocoupler means includes an input optically coupled to an output, and wherein said interface further includes means connecting the inputs of said first and second photocoupler means to said input data line, means connecting the outputs of said first and third photocoupler means to said output data line, means connecting the inputs of said third and fourth photocoupler means to said output of said data receiving and transmitting station, means connecting the output of said second photocoupler means to said input of said data receiving and transmitting station, and means connecting the output of said fourth photocoupler means to the input of said first photocoupler means.

* * * * *